(12) United States Patent
Yin et al.

(10) Patent No.: US 9,209,269 B2
(45) Date of Patent: Dec. 8, 2015

(54) SEMICONDUCTOR STRUCTURE AND METHOD FOR MANUFACTURING THE SAME

(75) Inventors: Haizhou Yin, Poughkeepsie, NY (US); Jing Xu, Beijing (CN); Yunfei Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/354,884

(22) PCT Filed: Dec. 1, 2011

(86) PCT No.: PCT/CN2011/083329
§ 371 (c)(1),
(2), (4) Date: Jun. 19, 2014

(87) PCT Pub. No.: WO2013/075349
PCT Pub. Date: May 30, 2013

(65) Prior Publication Data
US 2015/0162415 A1    Jun. 11, 2015

(30) Foreign Application Priority Data

Nov. 23, 2011    (CN) .......................... 2011 1 0375108

(51) Int. Cl.
*H01L 27/12* (2006.01)
*H01L 29/66* (2006.01)
(Continued)

(52) U.S. Cl.
CPC ........ *H01L 29/665* (2013.01); *H01L 21/28518* (2013.01); *H01L 21/324* (2013.01); *H01L 29/458* (2013.01); *H01L 29/66772* (2013.01);
(Continued)

(58) Field of Classification Search
CPC ............ H01L 21/28518; H01L 21/324; H01L 29/458; H01L 29/665; H01L 29/66772; H01L 29/78603; H01L 29/78618
USPC .......... 257/347, 382, 734; 438/151, 655, 296, 438/662, 300
See application file for complete search history.

(56) References Cited

U.S. PATENT DOCUMENTS 5,391,394 A * 2/1995 Hansen ................... C23C 16/04
257/E21.165
5,468,662 A * 11/1995 Havemann ........ H01L 21/76889
257/67

(Continued)

FOREIGN PATENT DOCUMENTS

CN           10304043 A      11/2008
CN           102044422 A      5/2011

*Primary Examiner* — Mohammed Shamsuzzaman
(74) *Attorney, Agent, or Firm* — Treasure IP Group, LLC (57) ABSTRACT

A method for manufacturing a semiconductor structure comprises following steps: providing an SOI substrate, forming a gate stack on the SOI substrate, forming sidewall spacers on sidewalls of the gate stack, and forming source/drain regions on each side of the gate stack; depositing a first metal layer on surfaces of an entire semiconductor structure, and then removing the first metal layer; forming an amorphous semiconductor layer on surfaces of the source/drain regions; depositing a second metal layer on surfaces of the entire semiconductor structure, and then removing the second metal layer; and annealing the semiconductor structure. Accordingly, the present invention further provides a semiconductor structure. The present invention is capable of effectively reducing contact resistance at source/drain regions.

7 Claims, 5 Drawing Sheets

(51) Int. Cl.
  *H01L 29/786* (2006.01)
  *H01L 21/285* (2006.01)
  *H01L 21/324* (2006.01)
  *H01L 29/45* (2006.01)

(52) U.S. Cl.
  CPC .... *H01L 29/78603* (2013.01); *H01L 29/78618* (2013.01)

(56) References Cited

U.S. PATENT DOCUMENTS

| | | | |
|---|---|---|---|
| 6,207,563 B1* | 3/2001 | Wieczorek | H01L 21/28518 257/E21.165 |
| 6,251,777 B1* | 6/2001 | Jeng | H01L 21/28052 257/E21.165 |
| 6,835,656 B1* | 12/2004 | Besser | H01L 21/28518 257/E21.165 |
| 7,226,827 B2* | 6/2007 | Schram | H01L 21/28097 257/E21.199 |
| 8,283,732 B2* | 10/2012 | Sunamura | H01L 21/823835 257/388 |
| 8,575,023 B2* | 11/2013 | Ohmi | H01L 21/28079 257/407 |
| 2005/0258499 A1* | 11/2005 | Huang | H01L 21/28052 257/382 |
| 2007/0138563 A1* | 6/2007 | Callegari | H01L 21/823842 257/369 |
| 2008/0286921 A1* | 11/2008 | Yu | H01L 21/28052 438/238 |
| 2009/0004850 A1* | 1/2009 | Ganguli | C23C 16/18 438/655 |
| 2011/0318872 A1* | 12/2011 | Becker | H01L 31/022425 438/98 |

* cited by examiner

SEMICONDUCTOR STRUCTURE AND METHOD FOR MANUFACTURING THE SAME

CROSS REFERENCE TO RELATED APPLICATION

This application is a national stage application, filed under 35 U.S.C. §371, of PCT Application No. PCT/CN2011/083329, filed on Dec. 1, 2011, entitled "SEMICONDUCTOR STRUCTURE AND METHOD FOR MANUFACTURING THE SAME", which claimed priority to Chinese Application No. 201110375108.5, filed on Nov. 23, 2011, all of which are hereby incorporated by reference in their entirety.

FIELD OF THE INVENTION

The present invention relates to semiconductor manufacturing field, particularly, to a semiconductor structure and a method for manufacturing the same.

BACKGROUND OF THE INVENTION

One of methods usually used to reduce contact resistance at source/drain regions of a semiconductor structure is to form contact layers (which are usually metal silicide layers; accordingly, metal silicide layers are exemplified as contact layers hereinafter) on surfaces of source/drain regions. Namely, metal layers are deposited on surfaces of source/drain regions, then the semiconductor structure is annealed such that the metal layers react with source/drain regions to form metal silicide layers, then the metal layers that remain from reaction are removed at last. However, when aforesaid method is used to form metal silicide layers in the case source/drain regions are quite thin, for example, the semiconductor structure is ultra-thin SOI or finFET, silicon in source/drain regions would be easily depleted completely, and even silicon under sidewall spacers of a gate stack would be depleted as well during formation of metal silicide layers, which consequently leads to problems like silicide piping and further causes short-circuits between source and drain, during formation of metal silicide layers. Therefore, it is necessary to prevent complete depletion of silicon in source/drain regions during formation of metal silicide layers.

In the prior art, raised source/drain (RSD) or a self-limited process is usually used to prevent silicon in source/drain regions from being depleted completely. Wherein, the RSD method means to raise heads of source/drain regions to be higher than the bottom of the gate stack by way of, for example, epitaxial growing method. The RSD method can effectively increase thickness of source/drain regions, so as to prevent silicon in source/drain regions from being depleted completely by metal layers. Whereas, the self-limited process means to deposit metal layers on surfaces of source/drain regions, and then to remove the metal layers through etching or the like. In this case, although metal layers on surfaces of source/drain regions are removed, some metal has still come into source/drain regions during deposition; consequently, thin metal silicide layers would be formed on surfaces of source/drain regions after the semiconductor structure experiences annealing process. Since metal coming into source/drain regions is not so much that the thickness of the metal silicide layers is usually around 2 nm; therefore, it is an effective way to guarantee silicon in source/drain regions from being depleted completely.

However, abovementioned two methods still experience some defects. Although silicon in source/drain regions is saved from being depleted completely through increasing thickness of source/drain regions by means of RSD method, this also increases distance between metal silicide layers and channels at the meantime, thereby hindering performance of semiconductor devices. Likewise, although the metal silicide layers formed on surfaces of source/drain regions by means of self-limited process are quite thin, their lateral electrical resistance is rather great, which impairs performance of semiconductor devices as well.

Therefore, it is intended herein to provide a semiconductor structure and a method for manufacturing the same, which can overcome abovementioned problems.

SUMMARY OF THE INVENTION

The present invention aims to provide a semiconductor structure and a method for manufacturing the same, which can effectively reduce contact resistance at source/drain regions at the mean time of guaranteeing performance of semiconductor structures.

In one aspect, the present invention provides a method for manufacturing a semiconductor structure, which comprises following steps:

a) providing an SOI substrate, forming a gate stack on the SOI substrate, forming sidewall spacers on sidewalls of the gate stack, and forming source/drain regions on each side of the gate stack;

b) depositing a first metal layer on surfaces of an entire semiconductor structure, then removing the first metal layer;

c) forming an amorphous semiconductor layer on surfaces of the source/drain regions;

d) depositing a second metal layer on surfaces of the entire semiconductor structure, then removing the second metal layer; and annealing the semiconductor structure.

In another aspect, the present invention further provides a semiconductor structure, which comprises:

an SOI substrate;
a gate stack located on the SOI substrate;
sidewall spacers located on sidewalls of the gate stack;
source/drain regions located on each side of the gate stack, wherein,
a first contact layer is arranged on surfaces of the source/drain regions; and
one or more amorphous semiconductor layer(s) are arranged on the source/drain regions, and second contact layers are arranged on the surface of each amorphous semiconductor layer.

As compared to the prior art, the present invention exhibits following advantages: with regard to a semiconductor structure with very thin source/drain regions, in particular, an ultra-thin SOI structure and a semiconductor structure having fins, the present invention proposes to form very thin first contact layers on surfaces of source/drain regions through self-limited process, then to form amorphous semiconductor layers on surfaces of source/drain regions, and then to form second contact layers on surfaces of the amorphous semiconductor layers through self-limited process. Formation of the thin first contact layers prevents semiconductor at source/drain regions from being depleted completely, thereby effectively suppressing short-circuits to occur between source and drain. Besides, owing to presence of amorphous semiconductor layers and second contact layers, contact resistance at source/drain regions can be reduced effectively. Therefore, the present invention can effectively reduce contact resistance at source/drain regions along with guaranteeing performance of semiconductor structures.

BRIEF DESCRIPTION OF THE DRAWINGS

Additional characteristics, objectives and advantages of the present invention are made more evident and easily understood according to perusal of the following detailed description of exemplary embodiment(s) in conjunction with accompanying drawings, wherein.

DETAILED DESCRIPTION OF THE INVENTION

Embodiments of the present invention are described in detail here below, wherein examples of the embodiments are illustrated in the drawings. It should be appreciated that the embodiments described below in conjunction with the drawings are illustrative and are provided for explaining the prevent invention only, thus shall not be interpreted as limitations to the present invention.

Various embodiments or examples are provided here below to implement different structures of the present invention. To simplify disclosure of the present invention, description of components and arrangements of specific examples is given below. Of course, they are illustrative only and not limiting the present invention. Moreover, in the present invention, reference numbers and/or letters may be repeated in different embodiments. Such repetition is for purposes of simplicity and clarity, yet does not denote any relationship between respective embodiments and/or arrangements being discussed. Furthermore, the present invention provides various examples for various process and materials. However, it is obvious for a person of ordinary skill in the art that other processes and/or materials may be utilized alternatively. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. It should be noted that component(s) illustrated in the drawings might not be drawn to scale. Description of conventional components, processing technologies and crafts are omitted herein in order not to limit the present invention unnecessarily.

Figure 1:
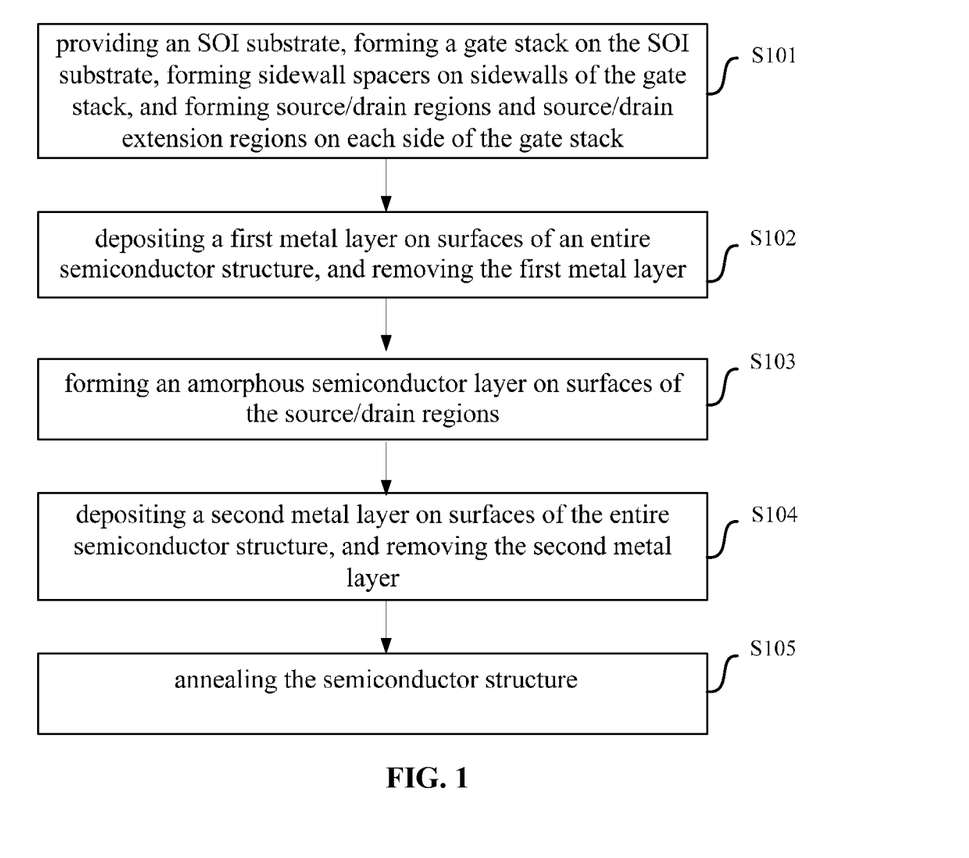
FIG. 1 illustrates a flowchart of a method for manufacturing a semiconductor structure according to the present invention.

The present invention provides a method for manufacturing a semiconductor structure. Here below, the method for manufacturing a semiconductor structure according to the flowchart of an embodiment of the present invention as shown in FIG. 1 is described specifically in conjunction with FIG. 2(a) to FIG. 2(h).

At step S101, an SOI substrate is provided, a gate stack is formed on the SOI substrate, sidewall spacers 240 are formed on sidewalls of the gate stack, and source/drain regions 131 and source/drain extension regions 130 are formed on each side of the gate stack.

Figure 2A:
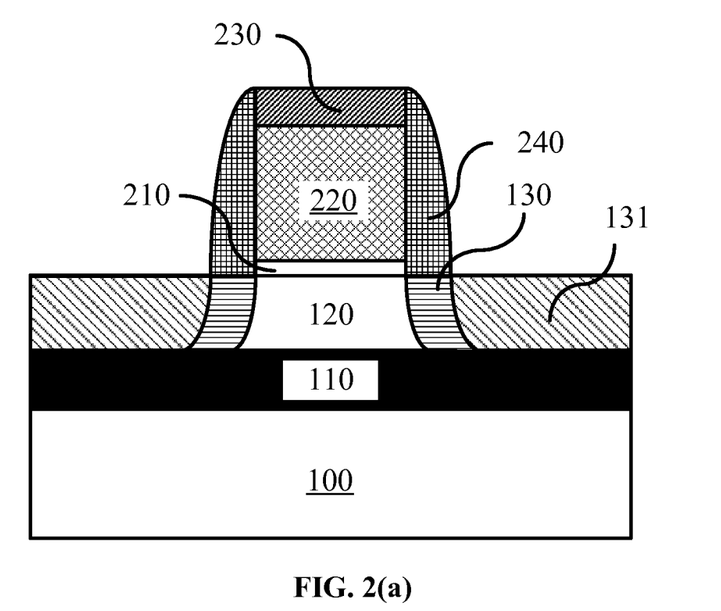
FIG. 2(a) to FIG. 2(h) illustrate cross-sectional diagrams of a semiconductor structure at respective stages of a method for manufacturing a semiconductor structure according to the flowchart of the embodiment of the present invention as shown in FIG. 1.
Figure 2B:
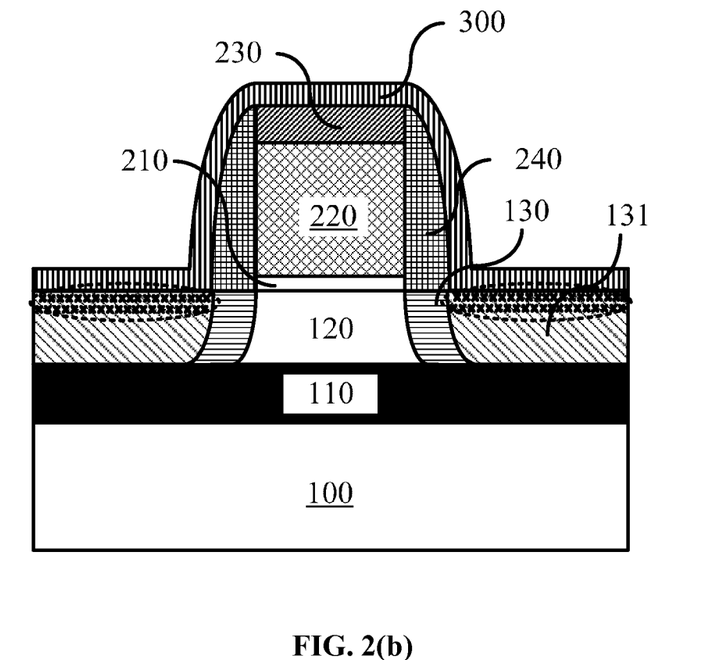
Figure 2C:
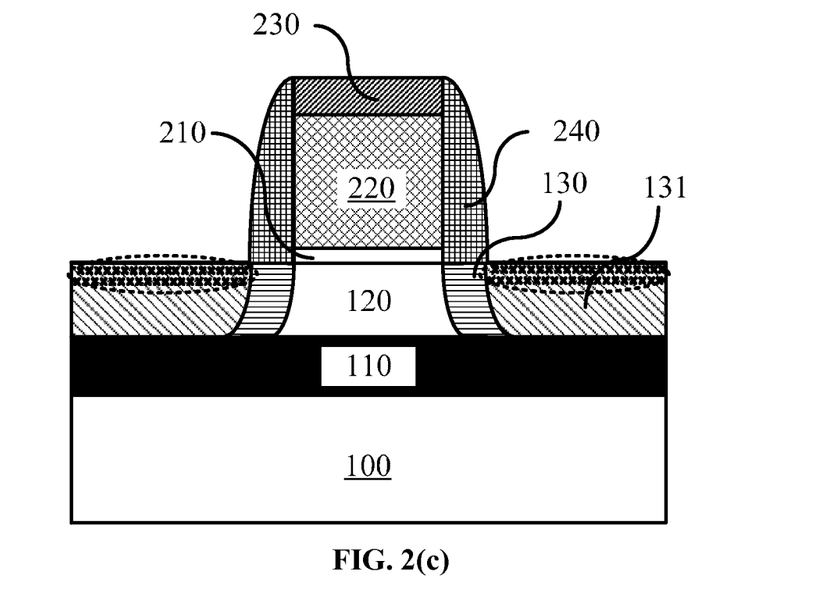
Figure 2D:
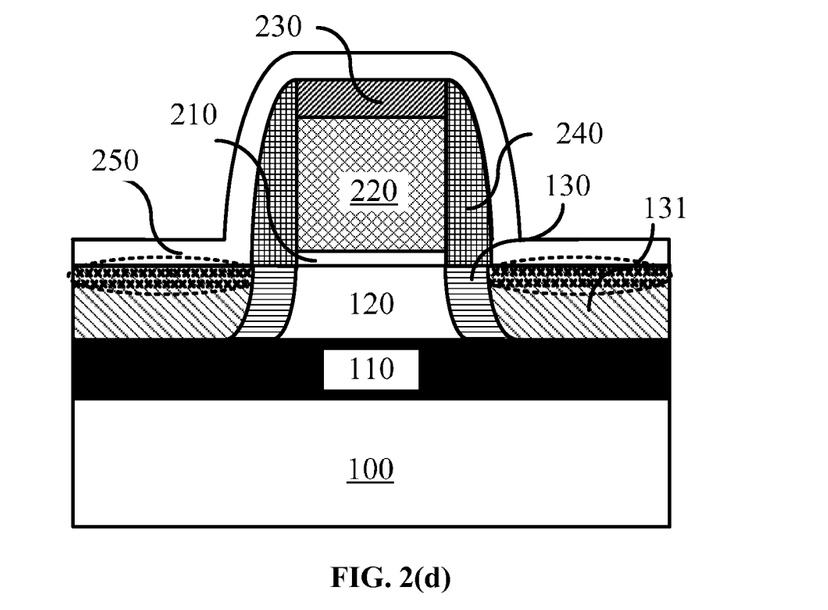

Specifically, as shown in FIG. 2(a), an SOI substrate is provided, wherein the SOI substrate comprises a semiconductor base 100, a buried oxide layer 110 located on the semiconductor base, and a semiconductor layer 120 located on the buried oxide layer 110. In the present embodiment, the material of the semiconductor base 100 is monocrystalline Si. In other embodiments, the material of the semiconductor base 100 may further comprise other basic semiconductors, for example, germanium. Alternatively, the material of the semiconductor base 100 may further comprise a compound semiconductor, for example, SiC, GaAs, InAs or InP. Typically, the semiconductor base 100 may have, but not limited to, a thickness of around several hundred micrometers, which for example may be in the range of 0.5 mm-1.5 mm. The buried oxide layer 110 may be $SiO_2$, $Si_3N_4$ or any other insulating material as appropriate; typically, the thickness of the buried oxide layer 110 is in the range of 200 nm-300 nm. The semiconductor layer 120 may be any semiconductor used as the semiconductor base 100. Here below, the semiconductor layer 120 made of monocrystalline Si is exemplarily specified. In the present embodiment, the SOI substrate is an ultra-thin-body SOI (UTBSOI) substrate, which has a very thin semiconductor layer 120, with a thickness usually less than 10 nm.

Next, a gate stack is formed on the SOI substrate; the gate stack comprises a gate dielectric layer 210, a gate 220 and a cap layer 230. The gate dielectric layer 210, which is located on the SOI substrate, may be high-k dielectric, for example, a material selected from a group consisting of $HfO_2$, HfSiO, HfSiON, HfTaO, HfTiO, $HfZrO$, $Al_2O_3$, $La_2O_3$, $ZrO_2$ and LaAlO or combinations thereof. In other embodiments, the material of the gate dielectric layer may further be a thermal oxide layer, comprising $SiO_2$ or $SiO_xN_y$. The thickness of the gate dielectric layer 210 may be 2 nm-10 nm, for example 5 nm or 8 nm. Then, the gate 220 is formed on the gate dielectric layer 210; the gate 220 may be a metal gate formed through depositing, for example, a material selected from a group consisting of TaC, TiN, TaTbN, TaErN, TaYbN, TaSiN, HfSiN, MoSiN, $RuTa_x$ and $NiTa_x$ or combinations thereof, and the thickness thereof may be 10 nm-80 nm, for example, 30 nm or 50 nm. In other embodiments, the gate 220 may further be a dummy gate, which is formed through depositing Poly-Si, Poly-SiGe, amorphous silicon and/or oxides. Finally, the cap layer 230 is formed on the gate 220 through depositing, for example, $Si_3N_4$, $SiO_2$, $SiO_xN_y$, SiC, or combinations thereof, for purposes of protecting the head area of the gate 220 from damage arising from subsequent processes.

After the gate stack is formed, source/drain extension regions 130 are formed in the semiconductor layer 120 by means of low-energy implantation. P-type or N-type dopants may be implanted into the semiconductor layer 120. Namely, if an NMOS semiconductor device is intended to be manufactured, N-type dopants, for example Boron and Indium, are implanted into the semiconductor layer 120; if a PMOS semiconductor device is intended to be manufactured, P-type dopants, for example Arsenic and Phosphorus, are implanted into the semiconductor layer 120. Then, the semiconductor structure is annealed to activate dopants in the source/drain extension regions 130. Source/drain extension regions 130 may not be formed in another embodiment.

Next, sidewall spacers 240 are formed on sidewalls of the gate stack for isolating the gate stack. The sidewall spacers 240 may be formed with a material selected from a group consisting of $Si_3N_4$, $SiO_2$, $SiO_xN_y$ and SiC or combinations thereof, and/or any other material as appropriate. The sidewall spacers 240 may have a multi-layer structure. The sidewall spacers 240 may be formed through depositing-etching process, whose thickness may be in the range of 10 nm-100 nm, for example 30 nm, 50 nm or 80 nm.

Then, P-type or N-type dopants are implanted into the semiconductor layer 120 through self-aligned process, so as to form source/drain regions 131 on each side of the gate stack. Namely, if an NMOS semiconductor device is intended to be manufactured, N-type dopants, for example, Boron and Indium, are implanted into the semiconductor layer 120; if a PMOS semiconductor device is intended to be manufactured, P-type dopants, for example, Arsenic and Phosphorus, are implanted into the semiconductor layer 120. Energy implanted for forming source/drain regions 131 is greater than energy implanted for forming source/drain extension regions 130. After implantation is completed, the semiconductor structure is annealed so as to activate dopants in the source/drain regions 131.

In other embodiments, a semiconductor structure having fins may be formed on an SOI substrate as well. Specifically, a mask is deposited on a semiconductor layer and then is patterned so as to form a semiconductor fin pattern. After the semiconductor layer is etched to form semiconductor fins, a gate stack is formed to cover the central part of the semiconductor fins and to extend bilaterally along directions perpendicular to the semiconductor fin. Next, source/drain extension regions are formed in the semiconductor fin on each side of the gate stack. Then, sidewall spacers are formed on sidewalls of the gate stack. Finally, source/drain regions are formed within the semiconductor fin on each side of the gate stack. Wherein, the thickness of the semiconductor fin is very thin, which is usually in the range of 5 nm to 40 nm.

The method provided by the present invention is applicable to abovementioned two structures; for purposes of succinctness, the method provided by the present invention is described in detail with example of abovementioned first semiconductor structure (i.e. conventional UTBSOI CMOS device semiconductor structure). According to the present invention, a person of ordinary skill in the art can easily think of application of the method provided by the present invention on abovementioned second semiconductor structure, thus it is not described in detail here in order not to obscure.

At step S102, a first metal layer 300 is deposited on an entire semiconductor structure, and then the first metal layer 300 is removed.

Specifically, the first metal layer 300 is formed on surfaces of the semiconductor structure by means of metal sputtering or chemical vapor deposition, as shown in FIG. 2(*b*). Wherein, the material of the first metal layer 300 (which is referred to as first metal hereinafter) may be Ni or NiPt, or any other metal as appropriate, for example, Ti, Co or Cu. Then, the first metal layer 300 is removed through, for example, dry etching or wet etching, as shown in FIG. 2(*c*). Although the first metal layer 300 is removed, some of the first metal has come into source/drain regions 131 during formation of the first metal layer 300. Because the energy used at formation of the first metal layer 300 is not so strong that the first metal, which has come into the source/drain regions 131, distributes substantially at areas close to upper surfaces of the source/drain regions 131 (e.g. portions enclosed by dotted lines shown in FIG. 2(*b*) and FIG. 2(*c*)).

At step S103, amorphous semiconductor layers 400 is formed on surfaces of the source/drain regions 131.

Specifically, an amorphous semiconductor 250 is deposited to cover the entire semiconductor structure by means of, for example, physical vapor deposition (PVD), chemical vapor deposition (CVD), atomic-layer deposition (ALD) or the like, as shown in FIG. 2(*d*). In the present embodiment, the amorphous semiconductor 250 is made of amorphous Si, while the amorphous semiconductor 250 may further be made of amorphous SiGe, amorphous SiC or the like in other embodiments. Next, the amorphous semiconductor 250 is doped with dopants, whose type is the same as the type of the semiconductor device. Namely, if the semiconductor device is NMOS, the amorphous semiconductor 250 is doped with N-type dopants, for example, Boron and Indium. If the semiconductor device is PMOS, the amorphous semiconductor 250 is doped with P-type dopants, for example, Arsenic and Phosphorus.

Figure 2E:
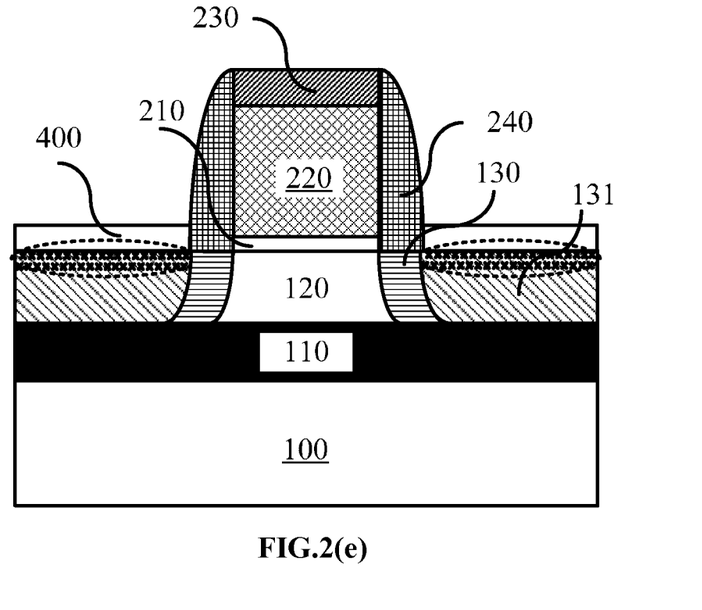
Figure 2F:
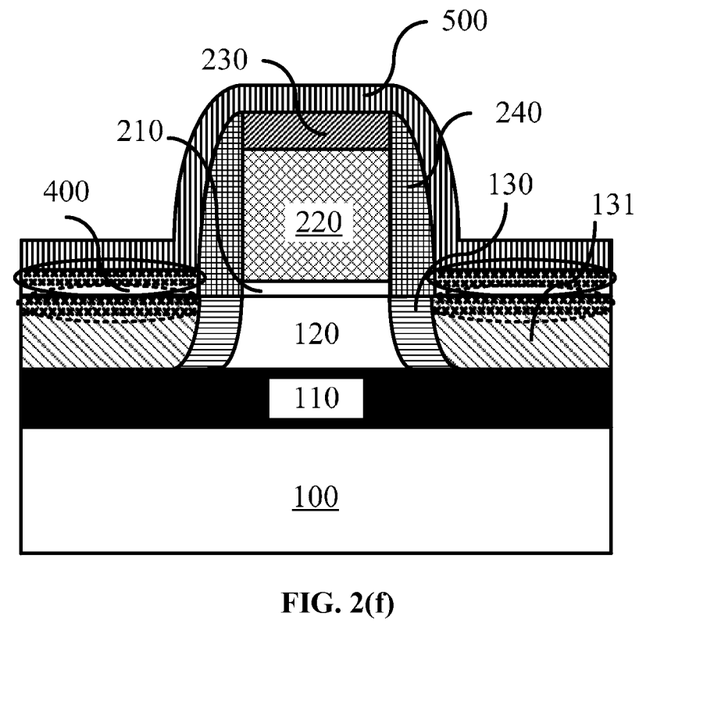
Figure 2G:
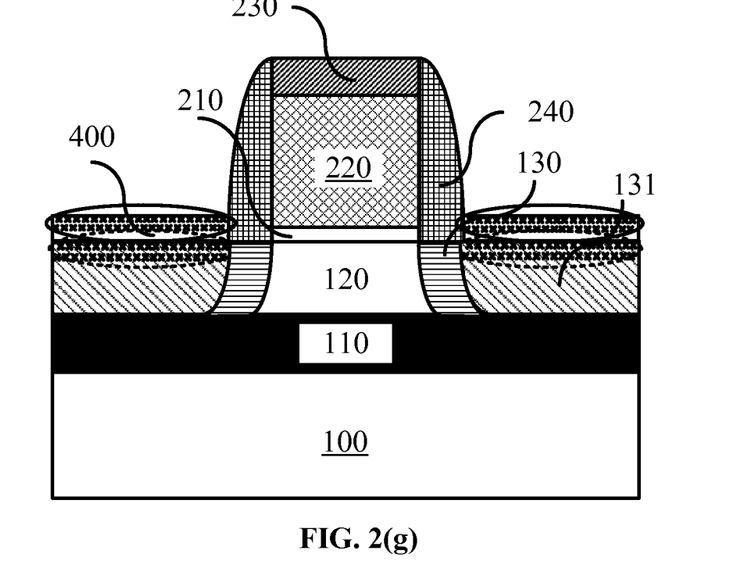

Then, the amorphous semiconductor 250 is patterned. For example, the amorphous semiconductor 250 cover the gate stack and sidewall spacers 240 is removed by means of lithography along with dry etching or wet etching, whereas the amorphous semiconductor layers 400 on surfaces of the source/drain regions 131 are kept, as shown in FIG. 2(*e*). Wherein, the thickness of the amorphous semiconductor layers 400 is in the range of 3 nm to 5 nm. In other embodiments, amorphous semiconductor layers 400 also may be formed directly on surfaces of the source/drain regions 131 by means of selective deposition. Here below, the amorphous silicon layers 400 is described exemplarily.

At step S104, a second metal layer 500 is deposited on surfaces of the entire semiconductor structure, then the second metal layer 500 is removed.

Specifically, after completion of patterning the amorphous Si layers 400, as shown in FIG. 2(*f*) and FIG. 2(*g*), self-limited process is implemented to the amorphous Si layers 400. Namely, the second metal layer 500 is deposited on surfaces of the entire semiconductor structure; then the second metal layer 500 is removed. Wherein, the material of the second metal layer 500 (which is referred to as the second metal hereinafter) is preferably same as the first metal. In the present embodiment, the material of the second metal layer 500 is Ni or NiPt. However, the material of the second metal may be different from the the first metal in other embodiments. Alike, some of the second metal has come into the amorphous silicon layers 400 (portions enclosed by firm lines shown in FIG. 2(*f*) and FIG. 2(*g*)), after the second metal layer 500 is removed.

At step S105, the semiconductor structure is annealed.

Specifically, the semiconductor structure is annealed, as shown in FIG. 2(*h*), wherein the annealing process comprises rapid thermal annealing, spike annealing and the like. In the present embodiment, the semiconductor structure experiences laser annealing at a temperature substantially above 1000° C. for a period about several micro-seconds, so as to enable the first metal that remains in the source/drain regions 131 to react with silicon in the source/drain regions 131 so as to form a first contact layer 310 (referred to as first metal silicide layer 310 hereinafter), and to enable the second metal that remains in the amorphous silicon layers 400 to react with the amorphous silicon layers 400 to form second contact layers 410 (referred to as second metal silicide layers 410 hereinafter). The first metal silicide layer 310 and/or the second metal silicide layers 410 comprise(s) NiSi or $Ni(Pt)Si_{2-y}$. Since the metal coming into the source/drain regions 131 and the amorphous silicon layers 400 are not so much, thus the first metal silicide layer 310 and the second metal silicide layers 410 are comparatively thin, whose thickness is about 2 nm. Additionally, because the thickness of the amorphous Si layers 400 is greater than or equal to the thickness of amorphous silicon depleted at formation of the second metal silicide layers 410, therefore, the second metal silicide layers 410 are formed entirely within the amorphous silicon layers 400; besides, amorphous silicon layers 400 remaining between the second metal silicon layers 410 and the source/ drain regions 131 may also function as transitional layers. Accordingly, the contact resistance at the source and drain regions 131 is reduced favorably, owing to formation of the first metal silicide layer 310 and the second metal silicide layers 410.

Optionally, in order to further reduce contact resistance at source/drain regions, step S103 and step S104 may be implemented repeatedly after implementation of step S102 and prior to implementation of step S105. Namely, an amorphous Si layer is arranged on the source/drain regions 131 repeatedly; meanwhile, a small amount of metal also is added onto the surface of each amorphous Si layer through self-limited process till a certain thickness has been built. Accordingly, multiple layers of silicide are formed through annealing at step S105, which thereby are effective to reduce contact resistance at source/drain regions.

Optionally, the semiconductor structure may be annealed instantly each time the metal is removed through etching Namely, the semiconductor structure may be annealed immediately after implementation of step S102 so as to form the first metal silicide 310 on surfaces of the source/drain regions 131. Then, the semiconductor structure is annealed immediately each time the amorphous silicon layer 400 is arranged at source/drain regions and a small amount of metal is added to each amorphous silicon layer 400 through depositing and etching the metal, such that thin layers of metal silicide is formed on the surface of the amorphous Si layers 400 accordingly.

As compared to the prior art, the present invention shows following advantages: with regard to a semiconductor structure with very thin source/drain regions, in particular, an ultra-thin SOI structure and a semiconductor structure having fins, the present invention proposes to form a very thin first contact layer on surfaces of source/drain regions through self-limited process, then to form amorphous semiconductor layers on surfaces of source/drain regions, and to form second contact layers on the surfaces of the amorphous semiconductor layers through self-limited process. The method provided by the present invention is not only capable of preventing semiconductors at source/drain regions and below sidewall spacers from being depleted completely; besides, as compared to the process of forming a contact layer on surfaces of source/drain regions alone through self-limited process, the method can further effectively reduce contact resistance at source/drain regions, owing to presence of the amorphous semiconductor layers and the second contact layers. As compared to the RSD method, the present invention can effectively shorten distance between second contact layer and channel regions, since the thickness of the amorphous semiconductor layers is in the range of 3 nm to 5 nm. Accordingly, as compared to traditional methods, the method provided by the present invention can produce semiconductor structures with better performance.

Figure 2H:
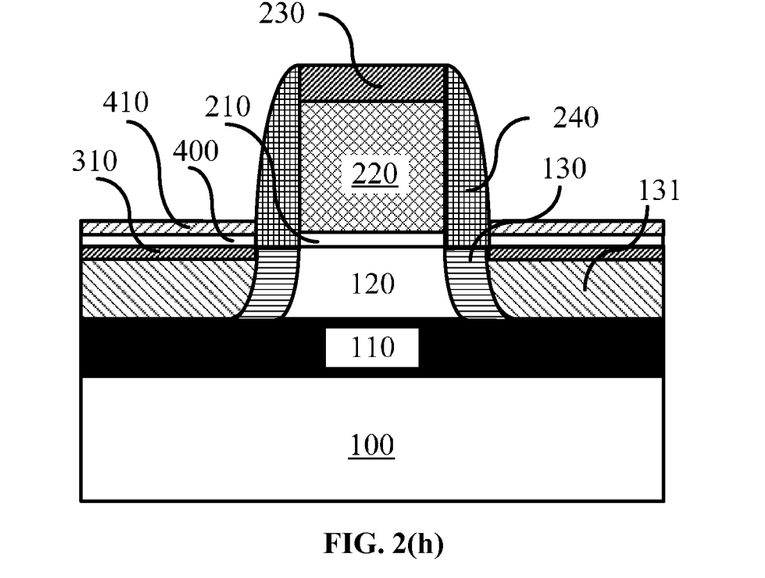

Accordingly, the present invention further provides a semiconductor structure. As shown in FIG. 2(h), the semiconductor structure comprises an SOI substrate, a gate stack, sidewall spacers 240, source/drain regions 131 and source/drain extension regions 130; wherein, the SOI substrate comprises a semiconductor base 100, a buried oxide layer 110 located on the semiconductor base and a semiconductor layer 120 located on the buried oxide layer 110. The material of the semiconductor base 100 may be monocrystalline silicon, or may further comprise other basic semiconductor like Germanium, or may further comprise a compound semiconductor, for example, SiC, GaAs, InAs or InP. The semiconductor base 100 may have, but not limited to, a thickness of around several hundred micrometers, which for example may be in the range of 0.5 mm-1.5 mm. The buried oxide layer 110 may be $SiO_2$, $Si_3N_4$ or any other insulating material as appropriate, with a thickness in the range of 200 nm-300 nm. The semiconductor layer 120 may be any semiconductor selected as the material of the semiconductor base 100. In the present embodiment, the SOI substrate is an ultra-thin-body SOI (UTBSOI) substrate having a very thin semiconductor layer 120, with a thickness usually less than 10 nm.

The gate stack, which is located on the SOI substrate, comprises a gate dielectric layer 210, a gate 220 and a cap layer 230. The gate dielectric layer 210 may be high-k dielectric or a thermal oxide layer, whose thickness is in the range of 2 nm to 10 nm. The gate 220 may be a metal gate, which may be Poly-Si, Poly-SiGe, amorphous Si and/or an oxide; or, the gate 220 may further be a dummy gate with a thickness of 10 nm to 80 nm. The cap layer 230 may comprise a material selected from a group consisting of $Si_3N_4$, $SiO_2$, $SiO_xN_y$, and SiC or combinations thereof, and is formed for protecting the head area of the gate 220.

The sidewall spacers 240 are located on sidewalls of the gate stack. The sidewall spacers 240 may comprise a material selected from a group consisting of $Si_3N_4$, $SiO_2$, $SiO_xN_y$, and SiC or combinations thereof, and/or any other material as appropriate. The sidewall spacers 240 may have a multi-layer structure, whose thickness may be in the range of 10 nm to 100 nm.

The source/drain extension regions 130 and the source/drain regions 131 are located within the semiconductor layer 120 of the SOI substrate; wherein, the source/drain extension regions 130 are located on each side of the gate stack and within the semiconductor layer 120 under the sidewall spacers 240; the source/drain regions 131 are located within the semiconductor layer 120 on each side of the sidewall spacers 240.

A first contact layer 310 is arranged on surfaces of the source/drain regions 131. Wherein, the first contact layer 310 comprises NiSi or $Ni(Pt)Si_{2-y}$, whose thickness is about 2 nm.

One or more amorphous semiconductor layer(s) 400 are arranged on the source/drain regions 131, wherein second contact layers 410 are deposed on the surface of each amorphous semiconductor layer 400. Specifically, the amorphous semiconductor layers 400 is preferably made of amorphous Si, or may be made of amorphous SiGe, amorphous SiC or the like, with a thickness in the range of 3 nm to 5 nm. The amorphous semiconductor layers 400 have dopants of same type as that of the semiconductor structure. Namely, if the semiconductor device is NMOS, dopants implanted into the amorphous semiconductor layers 400 are N-type. If the semiconductor device is PMOS, dopants implanted into the amorphous semiconductor layers 400 is P-type. The second contact layers 410 comprise NiSi or $Ni(Pt)Si_{2-y}$, whose thickness is similar to the thickness of the first contact layer 310, i.e., about 2 nm.

In other embodiments, the semiconductor structure provided according to the present invention may further be a semiconductor structure having fins which, similar to aforesaid semiconductor structure with SOI, comprises a very thin first contact layer on surfaces of source/drain regions (usually sources/drain regions are intended to be formed at each end of the fin), at least one amorphous semiconductor layer on source/drain regions, and second contact layers on the surface of each amorphous semiconductor layer. Since a person of ordinary skill in the art can easily understand aforesaid structure, thus it is not described in detail here in order not to obscure.

The semiconductor structure provided by the present invention shows following advantages: short-circuits occurring between source and drain shall be avoided owing to the thin first contact layer on surfaces of source/drain regions; whereas, there is at least one layer of amorphous semiconductor layers on surfaces of the source/drain regions and second contact layers on the surface of each amorphous semiconductor layer, thus presence of the amorphous semiconductor layers and the second contact layers can effectively reduce contact resistance at source/drain regions; additionally, in the semiconductor structure provided by the present invention, the thickness of the amorphous semiconductor layers is in the range of 3 nm to 5 nm, thus the present invention can effectively shorten distance between the second contact layer and channel regions, thereby performance of the semiconductor device is significantly enhanced, as compared to semiconductor structures with raised source/drain regions.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method of manufacturing a semiconductor structure, comprising:
    a) providing an SOI substrate, forming a gate stack on the SOI substrate, forming sidewall spacers on sidewalls of the gate stack, and forming source/drain regions on each side of the gate stack;
    b) depositing a first metal layer on surfaces of the entire semiconductor structure, and then removing the first metal layer before any annealing, wherein some of the first metal layer has come into source/drain regions during formation of the first metal layer;
    c) depositing an amorphous semiconductor layer to cover the semiconductor structure; doping the amorphous semiconductor layer; removing a part of the amorphous semiconductor layer, and keeping the amorphous semiconductor layer on surfaces of the source/drain regions;
    d) depositing a second metal layer on surfaces of an entire semiconductor structure, and then removing the second metal layer before any annealing, wherein some of the second metal layer has come into the amorphous silicon layers after the second metal layer is removed;
    e) annealing the semiconductor structure to form a first contact layer on surfaces of the source/drain regions and second contact layers are formed on the upper surface of each amorphous semiconductor layers on surfaces of the source/drain regions and some of the amorphous semiconductor layer remains between the first metal silicide layer and the second metal silicide layer after the annealing;
    wherein step b) occurs before step c) and e).

2. The manufacturing method of claim 1, wherein the material of the first metal layer and/or the second metal layers comprises Ni or NiPt.

3. The manufacturing method of claim 1, wherein, the first contact layer and the second contact layers have a thickness of 2 nm.

4. The manufacturing method of claim 3, wherein the first contact layer and the second contact layers comprises NiSi.

5. The manufacturing method of claim 1, wherein the type of dopants is the same as the type of a semiconductor device intended to manufacture.

6. The method of claim 5, wherein the amorphous semiconductor layers on surfaces of the source/drain regions are amorphous Si layers.

7. The method of claim 5, wherein the amorphous semiconductor layers on surfaces of the source/drain regions have a thickness between 3 nm to 5 nm.

* * * * *